United States Patent [19]

Miura et al.

[11] 3,938,178
[45] Feb. 10, 1976

[54] PROCESS FOR TREATMENT OF SEMICONDUCTOR

[75] Inventors: Shunji Miura, Higashikurume; Toshio Kawamata, Fujimi, both of Japan

[73] Assignee: Origin Electric Co., Ltd., Tokyo, Japan

[22] Filed: Dec. 19, 1972

[21] Appl. No.: 316,579

[30] Foreign Application Priority Data
Dec. 22, 1971 Japan............................ 46-104403

[52] U.S. Cl. ..................... 357/91; 29/578; 29/584; 29/590
[51] Int. Cl.............................................. B01j 17/00
[58] Field of Search.......... 29/576 B, 578, 584, 585, 29/590; 317/235 AY; 357/91

[56] References Cited
UNITED STATES PATENTS

| | | |
|---|---|---|
| 3,540,925 | 11/1970 | Athanas............................ 29/576 B |
| 3,590,471 | 7/1971 | Lepselter........................... 29/576 B |
| 3,595,716 | 7/1971 | Kerr............................. 317/235 AY |
| 3,622,382 | 11/1971 | Karl................................. 29/576 B |
| 3,691,376 | 9/1972 | Bauerlein..................... 317/235 AY |

Primary Examiner—W. Tupman
Attorney, Agent, or Firm—Harold L. Stults

[57] ABSTRACT

In the embodiment is specifically described a method for irradiating a transistor device with radiant rays. The top surface of the semiconductor crystal contained in the transistor device is exposed to the radiant rays so that the radiated energy impinging upon a preselected part of the base region, underneath the emitter electrode, is less than that impinging upon the other parts of the base region. Masking and radiant ray absorptive material are used to facilitate the process. Thereafter, the device and/or crystal is subjected to heat treatment to selectively improve such characteristics of the transistor as amplifying and switching characteristics to produce transistors suitable to a necessity of different applications.

9 Claims, 3 Drawing Figures

PROCESS FOR TREATMENT OF SEMICONDUCTOR

The present invention relates to a process for treatment of a transistor and, more particularly, it is directed to a process for irradiating a transistor with electron rays to reduce its switching time. It has been publicly known that when a semiconductor crystal is irradiated with high energy radiant rays such as electron ray, lattice defects are produced in the crystal. Such lattice defects act as recombination centers of minority carriers, so that the lifetime of the minority carriers is considerably reduced. Accordingly, if the transistor is irradiated with the electron rays, the lifetime of the base region is considerably reduced, the switching time may be reduced, the current amplifying factor is greatly decreased, and the collector-emitter saturation voltage is greatly increased, so that the transistor becomes unuseable.

By carrying out a number of experiments, we have found that it is possible to reduce the switching time while maintaining the current amplifying factor and the collector-emitter saturation voltage at practicable values. That is accomplished by irradiating a transistor including its emitter electrode made of lead or other radiant ray-absorptive material with electron ray from the side of said transistor on which said emitter electrode is formed, and then applying heat treatment thereto.

We consider that such an effect can be obtained for the reasons which will now be discussed. As described above, the lifetime of the base region of a transistor has close relationships with switching time, the current amplifying factor, and the collector-emitter saturation voltage of the transistor. More particularly, the lifetime of the part of the base region sandwiched between the emitter region and the collector region (hereinafter referred to as "localized base region") has an especially close relationshop to the current amplifying factor and the collector-emitter saturation voltage. Accordingly, when a transistor including its emitter electrode made of lead or other radiant ray absorptive material is irradiated with electron rays from the side of said transistor on which said emitter electrode is positioned, the crystal atoms in said localized base region receive only displacing energy of subcritical value owing to said region being masked by the emitter electrode.

On the contrary, the other part of the base region, that is, the part which is not masked by the emitter electrode (hereinafter referred to as "major base region") is subjected to direct irradiation of the electron ray, so that the crystal atoms receive displacing energy of supercritical value and consequently complete lattice defects are produced. By applying heat treatment to the transistor thus irradiated with the electron ray, the crystal atoms in the localized base region which has received only displacing energy of subcritical value will restore their original proper arrangement while the lattice defects in the major base region will not be recovered.

As the result, the lifetime of the localized base region is only slightly reduced, while the lifetime of the major base region is sufficiently reduced so that it is possible to reduce the switching time, while maintaining the current amplifying factor and the collector-emitter saturation voltage at their practicable values.

Accordingly, it is an object of the present invention to reduce the switching time of a transistor, while maintaining its current amplifying factor and collector-emitter saturation voltage at their practicable values.

Still further object of the present invention will be made clear from the embodiment which is described hereunder, in which.

Figure 1:
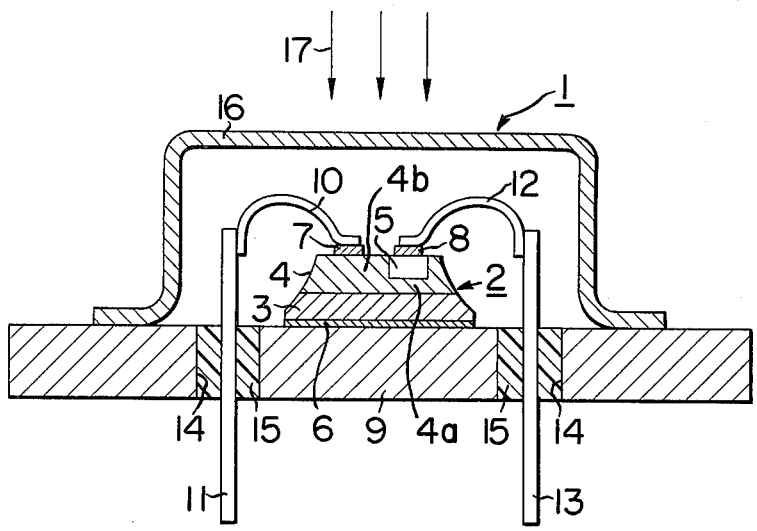
FIG. 1 is a longitudinal cross sectional view of a diffusion type silicon transistor illustrating how radiant rays is irradiated.

In FIG. 1, transistor device 1 includes n-p-n type silicon crystal 2 which is composed of n conductivity type collector region 3, p conductivity type base region 4 and n conductivity type emitter region 5. The base region 4 comprises a localized base region 4a which is sandwiched between the emitter region 5 and the collector region 3, and a major base region 4b which is situated around said localized base region.

Collector region 3 is ohmic-contacted with collector electrode 6 of, e.g., molybdenum, base region 4 with base electrode 7 of, e.g., lead-tin alloy, emitter region 5 with emitter electrode 8 of about 1 mm thick lead, respectively via a nickel plated layer (not illustrated).

Collector electrode 6 is attached to header 9, base electrode 7 is led out of device 1 extending through header 9 by silver wire 10 and base lead 11, and emitter electrode 8 is likewise led out by silver wire 12 and emitter lead 13.

Base lead 11 and emitter lead 13 are, respectively, electrically insulated from header 9 by resin 15 in the apertures 14. Metal cap 16 hermetically seals said silicon crystal 2 together with header 9, and protects said silicon crystal 2 from atmospheric moisture, dust and detrimental gases and, in the embodiments, an iron cap of 0.3 mm thickness is used.

An irradiation energy of more than a critical energy $Ed$ determined by the atoms composing said crystal lattice is required to displace the crystal lattices by irradiation of electron rays to produce lattice defects.

For example, the minimum irradiation energy $Et$ which is required for producing lattice defects by irradiating an electron ray upon silicon crystal lattice (critical energy $Ed = 13$ eV) is derived from the following equation:

$$E_{tt} = \frac{2E_t(E_t + 2M_1C^2)}{M_2C^2}$$

wherein:

$M_1$ : rest mass of electron
$M_2$ : atomic mass of silicon
$C$ : light velocity From the equation above, it will be seen that, when silicon crystal is used, irradiation energy of electron rays of at least about 0.5 MeV is required. In view of the above consideration, the transistor 1 is irradiated with the electron rays of 1 MeV in the direction of the arrows 17, that is, from the side of said transistor on which the emitter electrode is formed. By the irradiation, the major base region 4b which is not masked by the emitter electrode is irradiated with the electron rays of about 0.6 MeV under the electron ray absorbing effect due to the iron cap 16 only, so that many lattice defects are produced therein.

On the contrary, almost all of the electron rays directing to the localized base region 4a is absorbed by the iron cap 16 and the emitter electrode 8 consisting of lead, and consequently less lattice defects are produced in the localized base region 4a than that produced in the major base region 4b.

For example, as the materials for the emitter electrode, other than lead which was mentioned in said embodiment, copper, iron, gold, platinum or tungsten which have relatively large atomic number will be suitable.

The current amplifying factor of the transistor on which an electron ray has been irradiated greatly decreases, and the saturation voltage across the collector and emitter thereof becomes too high, thus making the transistor non-usable.

But, in accordance with the present invention, by successive heat treatment of said transistor, the current amplifying factor and its saturation voltage caused to return to be practicable values.

In the heat treatment of the present invention, the temperature is especially critical.

Figure 2:
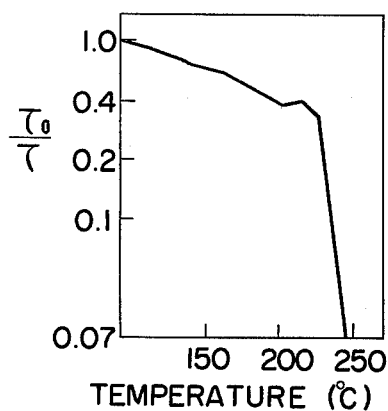
FIG. 2 is a diagram showing the relation of recovery ratio of life time of minority carriers and temperature of heat treatment in silicon crystal which is irradiated with electron rays.

The life time of the carriers, which is substantially in inverse proportion to the number of lattice defects, recovers as the temperature of treatment rises, as shown in FIG. 2. As is clear from said FIG. 2, it recovers rapidly at around 220°C, contrary to the features of the present invention.

FIG. 2 shows the recovery ratio of life time of carriers where, after irradiating the electron rays upon silicon crystal of resistivity of 2Ω-cm diffused with phosphor, said crystal is heated at each temperature for 30 minutes. In said FIG. 2, $\tau_0$ is the life time immediately after irradiation, $\tau$ is the life time at each heat treatment temperature, and $\tau_0/\tau$ expresses the recovery ratio.

Silicon transistors are is operated around 150°C at the maximum, and germanium transistor is operated around 120°C at the maximum. Hence, it is desirable that heat treatment is achieved at least at the maximum temperatures of operation stated above, and it is most convenient to heat treatment of the transistor around that temperature. It is practicable to accomplish the heat treatment by means of a heating furnace or passing current through the collector-emitter.

Figure 3:
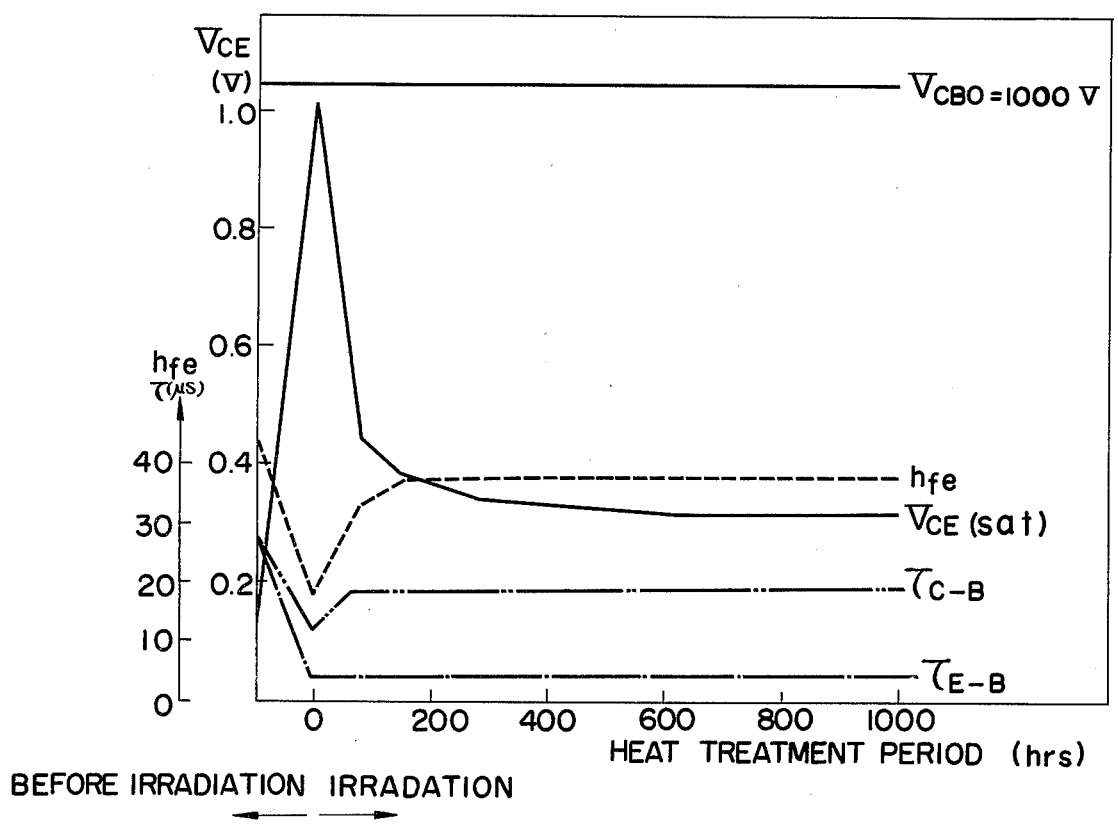
FIG. 3 is a diagram showing the various properties resulting from the heat treatment of transistor which is irradiated with electron rays.

FIG. 3 shows various properties of tested transistors before and after irradiation of electron rays and, further, the changes of various properties with respect to the treatment period after heat treatment at 150°C after irradiation. $V_{CBO}$ means collector-base breakdown voltage, $hfe$ means current amplifying factor, VcE (sat) means collector-emitter saturation voltage, $\tau_{C-B}$ means life time of carriers at collector-base junction, $\tau_{E-B}$ means life time of carriers at emitter-base junction.

As is clear from the changes shown in FIG. 2, immediately after irradiation of electron rays, $\tau_{C-B}$ and $\tau_{E-B}$ are remarkably reduced and hfe is reduced, and VcE (sat) increases so high as 1.0 V, to reach an impractical high value. But, by heat treatment after irradiation, the various properties are stabilized first rapidly and later gradually.

After heat treatment for about 70 hrs., hfe is reduced and stabilized at 37, and VcE at 0.38 V which are practicable values, and $\tau_{C-B}$ is greatly reduced to 19 μs from 28 μs at the time of non-irradiation, and $\tau_{E-B}$ to 4 μs from 28 μs at the time of non-irradiation, and turn-off time and turn-on time decrease, namely, the switching characteristics can be improved also. $V_{CBO}$ remains at about 1000 V showing no change before and after irradiation.

The present process can, naturally, be applied to crystal itself before sealing with resin and/or metal cap.

As described in reference to the embodiment, it is most practical to apply this process to the transistor device after fabrication.

In the conventional method where a life time killer, such as gold or copper, is diffused, there was the disadvantage that the products lacked uniformity in switching characteristics and collector-emitter saturation voltage.

However, in accordance with the present invention, a variety of products suitable to different applications can be produced from identically processed transistor devices and/or crystals thereof regardless of whether a life time killer is diffused in the production process. In other words, the present invention has advantages in that the products can be selectively produced from conventional transistor devices and/or the crystal thereof to the suitable amplification use or for switching use by adjusting the irradiation according to the inherent characteristics thereof.

The present invention can be applied not only to the diffusion type transistor as it has been described above but also to the alloy type transistors not described in the embodiment.

While the invention has been described in terms of a specific embodiment, such showing and description is meant to be illustrative only and not restrictive, since obviously many changes, modifications and even outwardly quite different embodiments of the invention can be made without departing from the spirit and scope of the invention as is set forth in the appended claims.

We claim:

1. A process for imparting desirable characteristics to transistor devices of the type having a base region exposed at one surface of said transistor and an emitter region positioned at one side of said base region between an emitter electrode and a non-exposed, masked portion of said base region, said exposed base region being unmasked, and said emitter electrode being of electron ray absorptive material, said process comprising the steps of, irradiating the transistor device with electron rays directed towards said one side of said base region and into said exposed portion of said base region but with said emitter electrode masking said masked portion of said base region, said electron rays being of sufficient energy to produce recombination centers in the unmasked base portion while leaving the masked base portion substantially free of lattice defects, and thereafter heat treating said transistor device.

2. The process described in claim 1 wherein said heat treating is carried on within the range between 220° C and the maximum operating temperature of the transistor device.

3. In a process for treating transistor devices of the type having a base region exposed at one surface of said transistor and an emitter region positioned at one side of said base region between an emitter electrode and a masked portion of said base region, said exposed base region non-exposed being unmasked, and said emitter electrode being of electron ray absorptive material, the steps of, irradiating the transistor device with electron rays directed towards said one side of said base region to produce lattice effects selectively in said exposed portion of said base region and with said emitter electrode preventing the irradiating of said masked portion of said base region, said electron rays being of sufficient energy to produce recombination centers in the unmasked base portion while leaving the masked base portion substantially free of lattice defects, and thereafter heat treating said transistor device at a temperature within the range between the maximum operating temperature of the transistor device and 220° C.

4. A process for imparting desirable characteristics to transistor crystals of the type having a base region exposed at one surface of said transistor and an emitter region positioned at one side of said base region between an emitter electrode and a non-exposed, masked portion of said base region, said exposed base region being unmasked, and said emitter electrode being of electron ray absorptive material, said process comprising the steps of, irradiating a transistor crystal with electron rays directed towards said one side of said base region and into said exposed portion of said base region but with said emitter electrode masking said masked portion of said base region, said electron rays being of sufficient energy to produce recombination centers in the unmasked base portion while leaving the masked base portion substantially free of lattice defects, and heat treating said transistor crystal.

5. The process as described in claim 4 which includes the step of placing an enclosure around the transistor.

6. The process as described in claim 5 in which said heat treating is carried on after the transistor has been placed in the enclosure.

7. An article of manufacture made by the process of claim 1.

8. An article of manufacture made by the process of claim 3.

9. An article of manufacture made by the process of claim 4.

* * * * *